US007332917B2

(12) United States Patent
Doniger et al.

(10) Patent No.: US 7,332,917 B2
(45) Date of Patent: *Feb. 19, 2008

(54) METHOD FOR CALCULATING FREQUENCY-DEPENDENT IMPEDANCE IN AN INTEGRATED CIRCUIT

(75) Inventors: Kenneth J. Doniger, Menlo Park, CA (US); William M. Loh, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/946,422

(22) Filed: Sep. 21, 2004

(65) Prior Publication Data

US 2006/0061373 A1 Mar. 23, 2006

(51) Int. Cl.
*G01R 31/26* (2006.01)
*G06F 17/50* (2006.01)

(52) U.S. Cl. .................. 324/719; 324/765; 716/7; 716/8

(58) Field of Classification Search .............. 324/765, 324/719; 716/7, 8
See application file for complete search history.

(56) References Cited

U.S. PATENT DOCUMENTS

| 4,713,612 | A | * | 12/1987 | Takamine | 324/767 |
| 4,730,160 | A | * | 3/1988 | Cusack et al. | 324/158.1 |
| 5,644,277 | A | * | 7/1997 | Gulick et al. | 333/246 |
| 6,028,440 | A | * | 2/2000 | Roethig et al. | 324/765 |
| 6,559,667 | B1 | * | 5/2003 | Tarter | 324/760 |
| 6,802,047 | B1 | * | 10/2004 | Doniger | 716/5 |
| 7,260,797 | B2 | * | 8/2007 | Batterywala et al. | 716/5 |
| 2005/0235235 | A1 | * | 10/2005 | Doniger | 716/5 |

OTHER PUBLICATIONS

Wikipedia.org, definition of "Integrated Circuit", printed Aug. 8, 2006.*
Gharpurey et al. "Analysis and Simulation of Substrate Coupling in Integrated Circuits", Berkeley Wireless Research Center. Published 1994, pp. 1-26.*
"Numerically Stable Green Function for Modeling and Analysis of Substrate Coupling in Integrated Circuits", Niknejad et al., IEEE Transactions on Computer-Aided Design of Integrated Circuits and Systems, vol. 17, No. 4, Apr. 1998.

* cited by examiner

*Primary Examiner*—Anjan Deb
*Assistant Examiner*—Jeff Natalini
(74) *Attorney, Agent, or Firm*—Strategic Patent Group, P.C.

(57) ABSTRACT

A method for calculating frequency-dependent impedance in an integrated circuit (IC) having transistors coupled together by a line follows. First, partition the line into a plurality of rectangles of constant material. Then, solve for the minimum dissipated power in the plurality of rectangles. Finally, determine the frequency-dependent impedance from the minimum dissipated power.

30 Claims, 3 Drawing Sheets

METHOD FOR CALCULATING FREQUENCY-DEPENDENT IMPEDANCE IN AN INTEGRATED CIRCUIT

FIELD OF THE INVENTION

The present invention relates to circuit analysis, and more particularly to a method for calculating frequency-dependent impedance in an integrated circuit (IC).

BACKGROUND OF THE INVENTION

Integrated circuits (ICs) comprise many transistors and the electrical interconnections between them. ICs and chips have become increasingly complex, with the speed and capacity of chips doubling about every eighteen months. This increase has resulted from advances in design software, fabrication technology, semiconductor materials, and chip design. As feature sizes decrease, the non-ideal nature of the wires between transistors (interconnects) becomes more important. Circuit performance is more affected by the resistance, capacitance, and inductance of these interconnects. In the current generation of technology, and for the near future, signal wavelengths are much larger than the size of a chip. Thus, interconnects can be modeled as RC networks (inductance is typically excluded).

Conventionally, interconnects have been modeled using circuit analysis tools such as SPICE. This involves approximating a distributed system as a lumped system. A distributed system is one where resistance and capacitance are not localized in particular places, but rather spread throughout the entire system. A lumped system is one where particular components of resistance and capacitance are taken to be an accurate representation of all the resistance and capacitance in the system, with the assumption that there is no other resistance or capacitance (for example, over the line between two resistors). Once the lumped element model has been assembled, the circuit impedance (Z) can be found as a function of frequency.

FIG. 1 illustrates a conventional uniform system 2 with conductors 4. System 2 is a distributed system because conductors 4 have different amounts of resistance and capacitance in different places. System 2 may be represented by system 6, which is a lumped system. System 6 is a lumped system because resistors 10 represent all the resistance in system 6, while capacitors 12 represent all the capacitance in system 6.

By making cuts in conductor 4, segments 8 are formed and represented by resistors 10 and capacitors 12 in system 6. In a straight, uniform system such as system 2, making cuts is no problem. The accuracy of the lumped approximation depends on the operating frequency, and the number of resistors 10 and capacitors 12 (elements) used in the model, the latter being a function of the number of cuts made. As more elements are added to the lumped system, it becomes more accurate. One disadvantage of this is that the more complicated the distributed system is, the more time-intensive and expensive it is to calculate an accurate representation of the interconnect impedance. More cuts are required in order to accurately represent a complicated distributed system.

The placement of the cuts as well as the number of cuts will affect the accuracy of the solution. There is no known algorithm that will optimize cut placement. This makes cutting more of an art than a science, taking more time and effort to accurately represent the distributed system.

Accordingly, what is needed is a more cost-effective or efficient method for calculating frequency-dependent impedance in an IC. The present invention addresses such a need.

BRIEF SUMMARY OF THE INVENTION

Aspects of the present invention include a method for calculating frequency-dependent impedance in an integrated circuit (IC) having transistors coupled together by a line. First, the line is partitioned into a plurality of rectangles of constant material and a solution for the minimum dissipated power in the plurality of rectangles is found. Finally, the frequency-dependent impedance is determined from the minimum dissipated power.

According to the method disclosed herein, the present invention addresses the need for a cost-effective and efficient method of calculating frequency-dependent impedance. The invention provides a more efficient method than conventional approaches because it avoids iterations of segmentation and de-segmentation (cutting and joining), it is easier to manage relative accuracy between resistance and capacitance by solving for impedance (both resistance and capacitance in this case), the number of harmonics used in computing dissipated power may be adjusted for power, and an S-parameter circuit simulator or traditional delay calculator may be used at a later time.

DETAILED DESCRIPTION OF THE INVENTION

The present invention relates to circuit analysis, and more particularly to a method for calculating frequency-dependent impedance in an integrated circuit (IC). The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
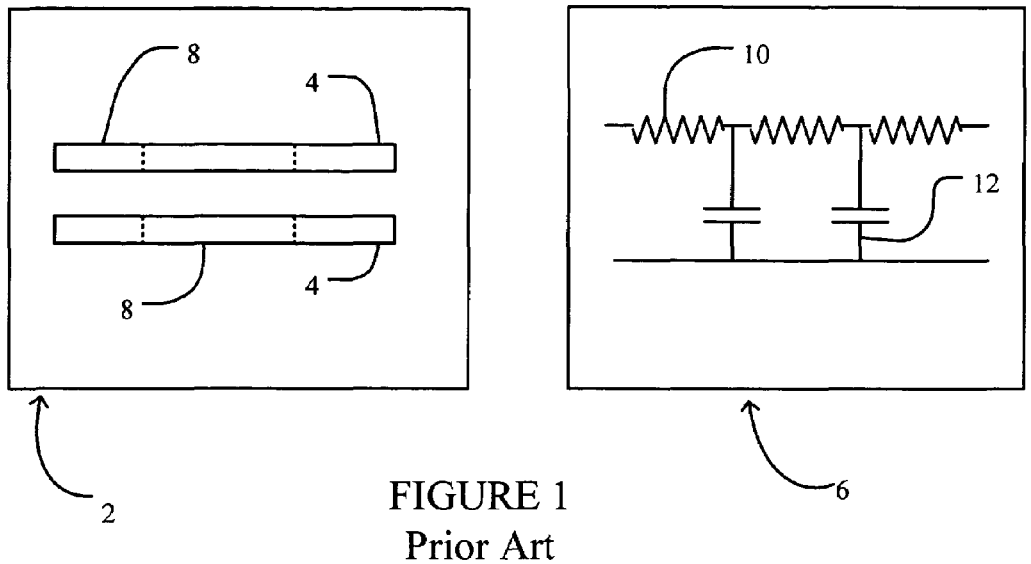
FIG. 1 is a block diagram illustrating a conventional distributed system and a lumped system.
Figure 2:
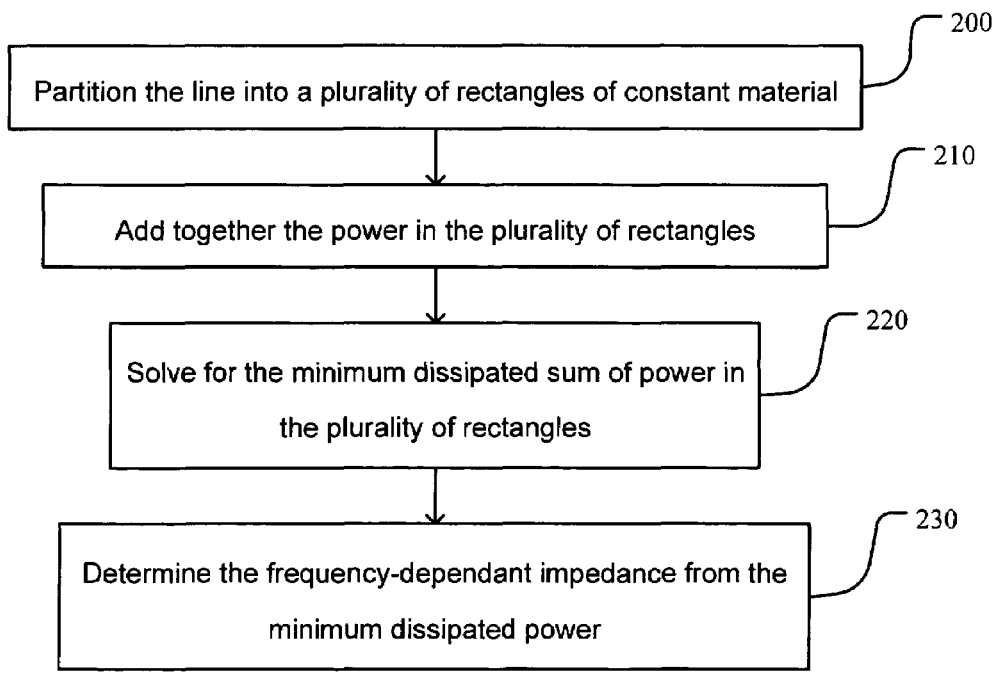
FIG. 2 is a flow diagram illustrating one method for determining frequency-dependent impedance from the minimum dissipated power.

FIG. 2 is a flow diagram illustrating one method for determining frequency-dependent impedance from the minimum dissipated power. The entirety of the method will be reviewed briefly, and then the individual blocks will be described in greater detail below and in conjunction with the remaining figures.

In block 200, a line, for example a conductor between two transistors in an integrated circuit (IC), is partitioned into a plurality of rectangles of constant material. The embodiments describing the invention refer to rectangles for simplicity, where a rectangle has dimensions in the X and Y direction, and no dependence on Z. The mathematics and formulae may be equally applied to a brick (or a rectangle with 3 dimensions) with dimensions in the X, Y, and Z direction. Another embodiment of the invention applies to conductors with boundaries parallel to any separable coordinate system. For example, the conductors could be concentric spheres. Rectangular conductors are more common in semiconductors.

In block 210, the power in each of the plurality of rectangles partitioned in block 200 are added together, resulting in a sum of power for the plurality of rectangles. If the entire system consisted of a single rectangle, then there would be no summation. In block 220, the minimum dissipated sum of power in the plurality of rectangles is found. Finally, in block 230, the frequency-dependent impedance may be determined from the minimum dissipated sum of power.

Figure 3:
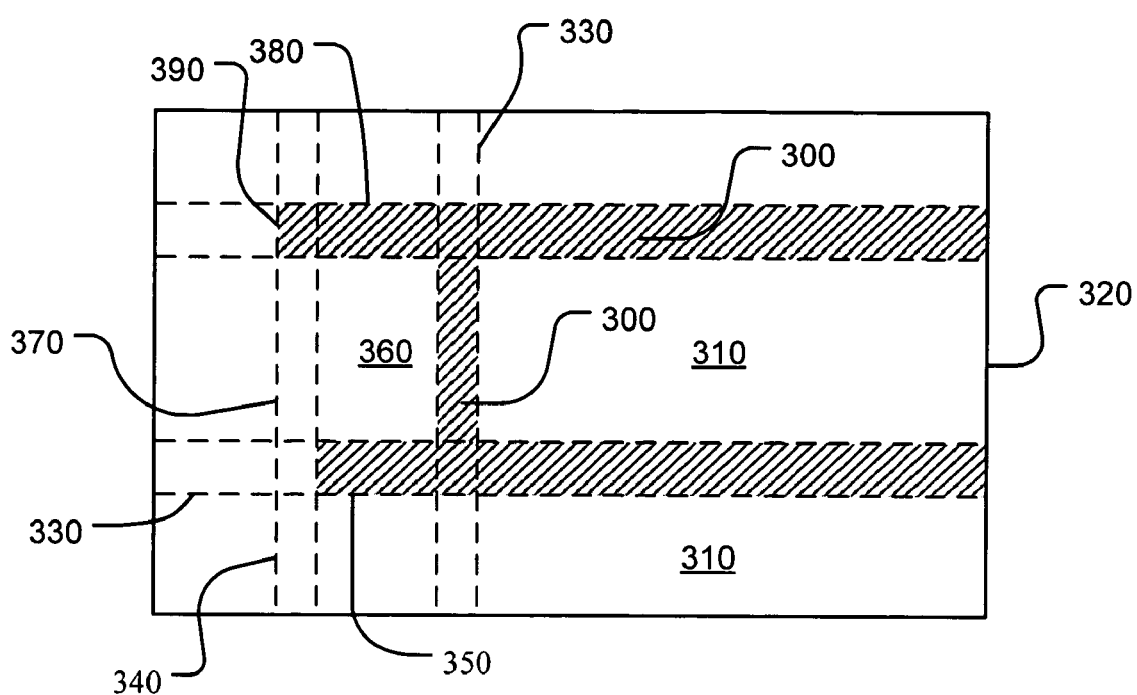
FIG. 3 is a block diagram illustrating one method of partitioning a system into rectangles.

FIG. 3 is a block diagram illustrating one method of partitioning a system into rectangles of constant material, as described in block 200 of FIG. 2. Constant material need not be pure material, but represents material for which differences in conductivity throughout the 'constant material' do not have significant impact on impedance calculations. For example, a copper line coupled to an aluminum pin may not be 'constant material' taken together (both the line and the pin), as well as a metal surrounded by a dielectric would not be constant material, taken together. Alternatively, a blend of iron and aluminum may be sufficiently uniform in conductivity that it can be modeled as a constant material.

Conductor 300 includes cross-hatched material in FIG. 3 while dielectric 310 is blank. Conductor 300 is surrounded by dielectric 310 and may be a part of line 320. Line 320 may be solely a conductor, a dielectric, a mix of the two or even any combination of materials in other categories (insulators, superconductors, etc). A line may include conductive wires, wires with dielectric slots of holes, including parts of dielectrics. A typical system of line 320 includes conductors with rectilinear boundaries surrounded by dielectrics.

Partitions 330 follow a side of a rectangle and may cross different materials. For example, partition 340 follows a side of rectangle 350, separating conductor 300 from dielectric 310. Partition 340 continues, creating a side of rectangles 360, 370, 380, and 390. Although rectangles 390 and 380, as well as rectangles 360 and 370, are constant material, being conductor 300 and dielectric 310 respectively, they are partitioned because every rectangle shares each side of itself with only one other rectangle. In other words, in this embodiment, rectangles do not overlap. A partition may be made between materials that are not constant. Each partition extends the entirety of line 320, in two or three dimensions, and divides the entire system into at least two parts (or more, for example when one partition crosses another partition).

Partitioning in FIG. 3 differs from cuts with conventional methods in that the properties of the rectangles are not being changed from a distributed to a lumped system.

Figure 4:
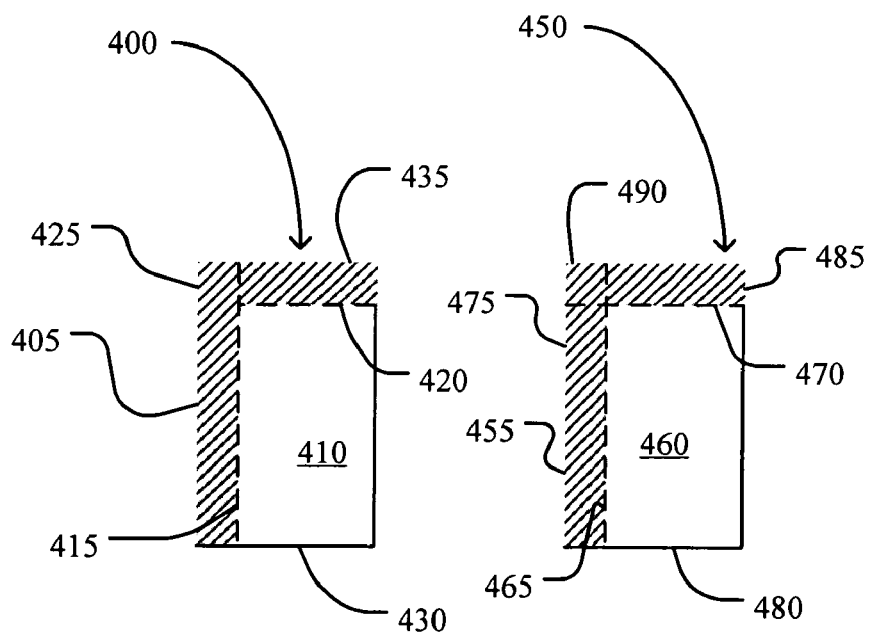
FIG. 4 is a block diagram illustrating a correct method of partitioning rectangles and an incorrect method of partitioning rectangles.

FIG. 4 is a block diagram illustrating a correct method for partitioning rectangles and an incorrect method for partitioning rectangles according to the embodiment of FIG. 3. Example 400 includes conductor 405 and dielectric 410. Partitions 415 and 420 create rectangles 425, 430, and 435. Both partitions 415 and 420 separate conductor 405 from dielectric 410, however only partition 415 continues through conductor 405 to create rectangle 435. Partition 420 stops at the point where rectangle 425 begins. The effect of this is that rectangle 425 shares the side of itself that was created by partition 415 with both of rectangles 430 and 435. In other words, rectangle 425 overlaps rectangles 430 and 435. Because partition 420 does not extend for the entirety of the system (or as far as this part of the distributed system is being approximated), example 400 is incorrect according to the embodiment in FIG. 3.

Example 450 includes conductor 455 and dielectric 460. Partitions 465 and 470 create rectangles 475, 480, 485, and 490. Both partitions 465 and 470 separate conductor 455 from dielectric 460, and both partitions 465 and 470 extend through conductor 455. The effect of this is that rectangle 475 shares the side of itself that was created by partition 465 with only rectangle 480. In other words, rectangle 475 no longer overlaps rectangles 480 and 485. The difference is made up with rectangle 490. Because partitions 465 and 470 extend for the entirety of the system, example 450 is correct according to the embodiment in FIG. 3.

Continuing with block 210 of FIG. 2, in order for the power in each of the plurality of rectangles to be added together, the power should be calculated. In one embodiment, a quasistatic approximation may be made because the signal wavelength is large compared to the system. Under the assumption that the electric field is well approximated by the gradient of a potential, Ohm's law holds, and the divergence of the current is zero everywhere (Kirchoff's current law applies). The value of the dissipated power may be found by solving Laplace's Equation. Solving Laplace's Equation is equivalent to minimizing $$P = \sigma \int_V (\nabla \Phi) \cdot (\nabla \Phi) dV, \tag{1}$$

where P is power, $\Phi$ is the electric potential, $\sigma$ is the conductivity, and the integral is taken over the volume of the system.

In order to find a solution for power, Equation 1 may be expressed for a single rectangle of extent w in x, extent l in y, and extent h in z. In order to simplify the expression and the example, only a two-dimensional situation will be provided, though one of ordinary skill in the art will understand how to apply it to three-dimensions. For this two-dimensional example there is no z-dependence in the expression. The electric potential is approximated with $$\Phi(x, y) = \frac{1}{2\sigma wlh}[A_0(w-x)^2 + B_0 x^2] + \frac{1}{2\sigma wlh}[C_0(l-y)^2 + D_0 y^2] + \tag{2}$$

$$\frac{1}{\sigma hl}\sum_{n=1}^{N} A_n \frac{\cosh(\beta_n w - \beta_n x)}{\beta_n \sinh(\beta_n w)}\cos(\beta_n y) + \frac{1}{\sigma hl}\sum_{n=1}^{N} B_n \frac{\cosh(\beta_n x)}{\beta_n \sinh(\beta_n w)}\cos(\beta_n y) +$$

$$\frac{1}{\sigma hw}\sum_{n=1}^{N} C_n \frac{\cosh(\alpha_n l - \alpha_n y)}{\alpha_n \sinh(\alpha_n l)}\cos(\alpha_n x) + \frac{1}{\sigma hw}\sum_{n=1}^{N} D_n \frac{\cosh(\alpha_n y)}{\alpha_n \sinh(\alpha_n l)}\cos(\alpha_n x),$$

where $\alpha_n = n\pi/w$, $\beta_n = n\pi/l$, and the four summations are Fourier series. The Fourier series terms are written in this way so that coefficients $A_n$, $B_n$, $C_n$, and $D_n$, will have units of current, and so that only one series will appear on each boundary when the current density that is perpendicular to that boundary is calculated. The equality sign is true as $N \rightarrow \infty$. As N increases, the approximation of the electric potential ($\Phi$) becomes more accurate.

Figure 5:
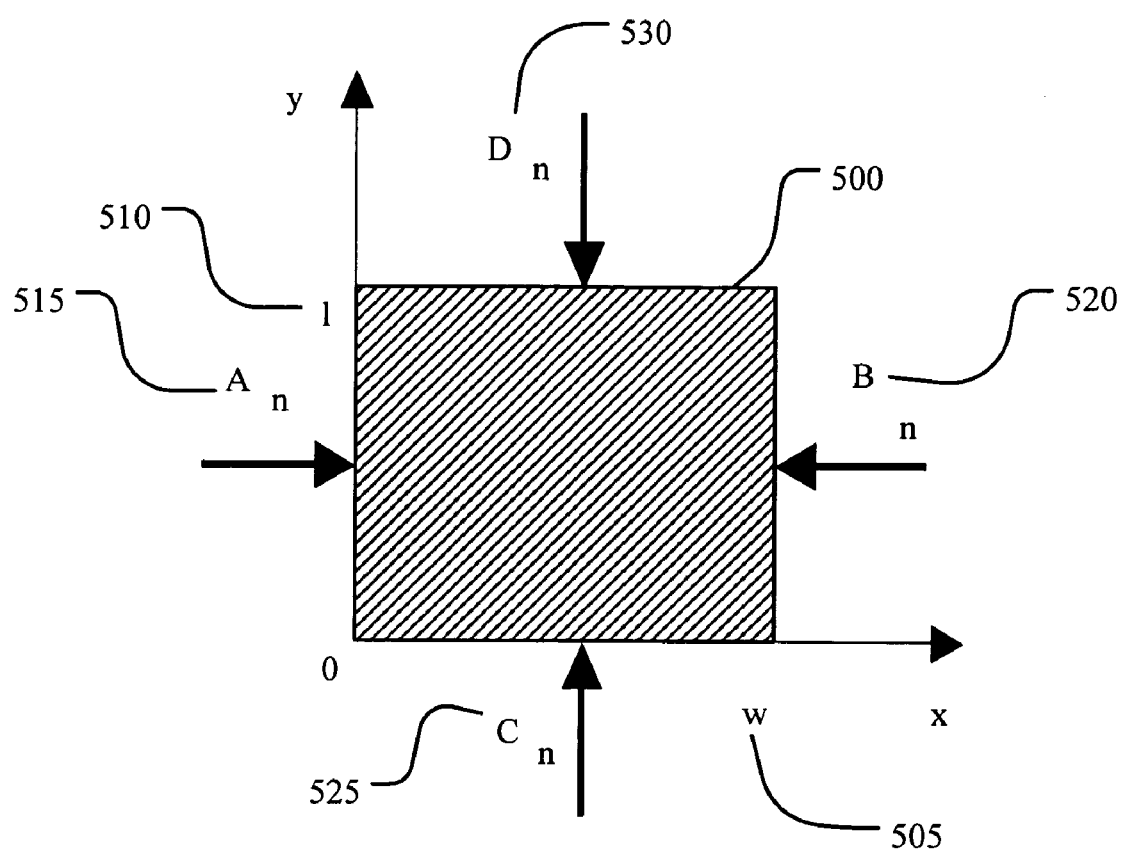
FIG. 5 is a graph diagram illustrating a block with Fourier coefficients associated with boundary currents.

FIG. 5 is a graph diagram illustrating a block with Fourier coefficients $A_n$, $B_n$, $C_n$, and $D_n$, which are associated with boundary currents. Rectangle 500 is one embodiment of a rectangle partitioned in block 200 of FIG. 2. Rectangle 500 has dimensions w 505 on the x-axis and a value of 510 on the y-axis. In accordance with the embodiment from FIG. 3, rectangle 500 is a constant material with conductivity $\sigma$. The Fourier coefficients associated with the boundary currents on each side are $A_n$ 515, $B_n$ 520, $C_n$ 530, and $D_n$ 530, with the respective arrows illustrating positive current direction.

Continuing with block 210 of FIG. 2, in order to find a solution to Equation 1, with respect to Equation 2, usual conductivity $\sigma$ is replaced with complex conductivity $\sigma + j\omega\epsilon$. In a static situation (where frequency is zero), the ideal dielectric is a perfect insulator with no DC current leaking through the dielectric. With a non-zero frequency there is a displacement current through an ideal dielectric where $\epsilon$ is the dielectric constant. Thus, in an ideal dielectric $\sigma = 0$, while in a conductor $\epsilon = 0$. Otherwise, conducting and dielectric regions (rectangles) may be treated identically. Substituting Equation 2 into Equation 1, with complex conductivity, yields $$P = \frac{w}{3hl(\sigma + j\omega\varepsilon)}(A_0^2 - A_0 B_0 + B_0^2) + \frac{l}{3hw(\sigma + j\omega\varepsilon)}(C_0^2 - C_0 D_0 + D_0^2) +$$

$$\frac{2w}{\pi^2 hl(\sigma + j\omega\varepsilon)}\sum_{n=1}^{N}\frac{C_n + D_n}{n^2}[A_0 + (-1)^n B_0] +$$

$$\frac{2l}{\pi^2 hw(\sigma + j\omega\varepsilon)}\sum_{n=1}^{N}\frac{A_n + B_n}{n^2}[C_0 + (-1)^n D_0] +$$

$$\frac{1}{2\pi h(\sigma + j\omega\varepsilon)}\sum_{n=1}^{N}\frac{1}{n}\left[\frac{A_n^2 + B_n^2}{\tanh(\beta_n w)} + \frac{2A_n B_n}{\sinh(\beta_n w)}\right] +$$

$$\frac{1}{2\pi h(\sigma + j\omega\varepsilon)}\sum_{n=1}^{N}\frac{1}{n}\left[\frac{C_n^2 + D_n^2}{\tanh(\alpha_n l)} + \frac{2C_n D_n}{\sinh(\alpha_n l)}\right] +$$

$$\frac{2}{\pi^2 h(\sigma + j\omega\varepsilon)}\sum_{m=1}^{N}\sum_{n=1}^{N}\frac{[A_m + (-1)^n B_m][C_n + (-1)^m D_n]}{n^2 l/w + m^2 w/l}.$$

(3)

Continuing with block 210, having a form of the solution for power in one rectangle (Equation 3), power in the remaining rectangles may be expressed and power for all the rectangles in the distributed system may be added together.

Continuing with block 220 from FIG. 2, a solution for the minimum dissipated sum of power may be found. While Equation 3 is the form of a solution, the Fourier coefficients $A_n$, $B_n$, $C_n$, and $D_n$ are not known because the boundary conditions, as illustrated in FIG. 5, are unknown. All the terms in the Equation 3 are quadratic in the Fourier coefficients. Combining the unknown coefficients in the m'th region yields $$x_m = [\underline{A}^T, \underline{B}^T, \underline{C}^T, \underline{D}^T]^T, \quad (4)$$

where $x_m$ is the column vector of all unknown Fourier coefficients in the region. If x is the concatenation of all unknown coefficients in all of the regions, then Equation 3 for power in the entire system can be written in matrix notation as $$P = x^T \cdot H \cdot x, \quad (5)$$

which is one expression for power to be minimized.

Constraints at rectangle boundaries may also be applied to solve for the minimum power (Equation 5). These constraints can be collected and written in matrix form as $$G \cdot x = b, \quad (6)$$

where x is, as before, the vector of unknown Fourier coefficients for the entire system. Individual equations of constraint fall into several categories. For example, at boundaries that are internal to the system, the special form of the boundaries and the orthogonality of cosines force individual Fourier components to match across a boundary. This is expressed, for example, as $$[B_n]_{region\ 1} + [A_n]_{region\ 2} = 0, \quad (7)$$

where $B_n$ and $A_n$ are elements of x. Equation (7) is homogeneous, so this element of b=0. Where current enters or leaves the system through a boundary, the constraint becomes inhomogeneous, and the corresponding element of b is positive for current entering the region (and thus, the system) and negative for current leaving. Note that Kirchoff's Current Law requires the total current entering the system to be equal to the total current leaving the system.

The mathematical system to solve comprises a system of equations that are quadratic in the unknowns, x, subject to linear constraints. This is a standard problem in optimization theory, known as "quadratic programming" (QP). Substituting Equation 6 into Equation 5 yields $$P = b^T [G \cdot H^{-1} \cdot G^T]^{-1} b \qquad (8)$$

which is the expression for minimum power. The expression may be evaluated because the unknown Fourier coefficients have dropped out.

Having solved for the minimum dissipated sum or power (or the power in a single rectangle), next, in block 230 of FIG. 2, the frequency-dependent impedance may be determined from the minimum dissipated power by using $$Z(\omega) = \frac{P(\omega)}{I^* I}, \qquad (9)$$

where impedance Z is a function of frequency $\omega$, I is the total current and Equation 8 is the expression used for power P. This process may be repeated for each frequency. In this way, the entire impedance ($Z(\omega)$) curve may be calculated. From $Z(\omega)$, important circuit performance parameters such as time delay, cross talk, and power utilization can be calculated. This method is a more stable and efficient way to calculate these parameters because it avoids cutting and Reduced Order Modeling.

While the above example demonstrates a two-terminal analysis, some circuits have more than two terminals. For a circuit with more than two terminals, the scalar impedance Z becomes an array. The elements of this array can be found using various combinations of two-terminal results and Kirchoff's Voltage Law.

As used here, a "computer-readable medium" can be any means that can contain or store a program. The computer-readable medium can be, for example but not limited to, a portable computer diskette, a random access memory (RAM), a read only memory (ROM), an erasable programmable read only memory (EPROM or Flash memory), or a portable compact disc read only memory (CD ROM).

A method and system for providing scalability in an integrated circuit has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for calculating frequency-dependent impedance in an integrated circuit (IC) having transistors coupled together by a line, the method comprising:
    partitioning the line into a plurality of rectangles of constant material;
    solving for a minimum dissipated power in the plurality of rectangles; and
    determining the frequency-dependent impedance from the minimum dissipated power.

2. The method of claim 1, solving for the minimum dissipated power further comprising:
    adding together the power in the plurality of rectangles; and
    solving for the minimum dissipated sum of power in the plurality of rectangles.

3. The method of claim 2 further comprising:
    generating a form of a solution for Laplace's equations for the electric potential in the rectangle.

4. The method of claim 3 further comprising:
    replacing usual conductivity with complex conductivity.

5. The method of claim 4 further comprising:
    calculating the power in the plurality of rectangles, the solution having a plurality of unknown Fourier coefficients.

6. The method of claim 5 further comprising:
    applying linear constraints to all the plurality of Fourier coefficients.

7. The method of claim 6, determining the frequency-dependent impedance further comprising:
    dividing the minimum dissipated sum of power by the product of a current through the rectangle with the conjugate of the current through the rectangle.

8. The method of claim 1, partitioning the line further comprising:
    partitioning the line into a plurality of rectangles of constant material, each rectangle sharing the entirety of a side with one other rectangle.

9. The method of claim 8 wherein two adjacent rectangles share a side and the shared side is the same size for each of the two adjacent rectangles.

10. The method of claim 1 wherein the rectangle of constant material is a brick of constant material.

11. The method of claim 1, partitioning the line further comprising:
    partitioning the line into a plurality of bricks of constant material, each brick sharing the entirety of a side with another brick.

12. The method of claim 11 wherein two adjacent bricks share a side and the shared side is the same size for each of the two adjacent bricks.

13. The method of claim 1, the line representing a part of a distributed circuit within the IC.

14. The method of claim 1, the line comprising a conductor.

15. The method of claim 1, the line comprising a dielectric.

16. A computer-readable medium containing programming instructions for calculating frequency-dependent impedance in an integrated circuit (IC) having transistors coupled together by a line, the programming instructions for:
    partitioning the line into a plurality of rectangles of constant material;
    solving for a minimum dissipated power in the plurality of rectangles; and
    determining the frequency-dependent impedance from the minimum dissipated power.

17. The computer-readable medium of claim 16, solving for the minimum dissipated power further comprising:
    adding together the power in the plurality of rectangles; and
    solving for the minimum dissipated sum of power in the plurality of rectangles.

18. The computer-readable medium of claim 17, the programming instructions further comprising:
    generating a form of a solution for Laplace's equations for the electric potential in the plurality of rectangles.

19. The computer-readable medium of claim 18, the programming instructions further comprising:
    replacing usual conductivity with complex conductivity.

20. The computer-readable medium of claim 19, the programming instructions further comprising:

calculating the power in the plurality of rectangles, the solution having a plurality of unknown Fourier coefficients.

21. The computer-readable medium of claim 20, the programming instructions further comprising:

applying linear constraints to all the plurality of Fourier coefficients.

22. The computer-readable medium of claim 21, determining the frequency-dependent impedance further comprising:

dividing the minimum dissipated power by the product of a current through the rectangle with the conjugate of the current through the rectangle.

23. The computer-readable medium of claim 16, partitioning the line further comprising:

partitioning the line into a plurality of rectangles of constant material, each rectangle sharing the entirety of a side with another rectangle.

24. The computer-readable medium of claim 23 wherein two adjacent rectangles share a side and the shared side is the same size for each of the two adjacent rectangles.

25. The computer-readable medium of claim 16 wherein the rectangle of constant material is a brick of constant material.

26. The computer-readable medium of claim 16, partitioning the line further comprising:

partitioning the line into a plurality of bricks of constant material, each brick sharing the entirety of a side with another brick.

27. The computer-readable medium of claim 26 wherein two adjacent bricks share a side and the shared side is the same size for each of the two adjacent bricks.

28. The computer-readable medium of claim 16, the line representing a part of a distributed circuit within the IC.

29. The computer-readable medium of claim 16, the line comprising a conductor.

30. The computer-readable medium of claim 16, the line comprising a dielectric.

* * * * *